United States Patent
Yang et al.

(10) Patent No.: US 7,315,216 B2
(45) Date of Patent: Jan. 1, 2008

(54) ADJUSTING FREQUENCY DEVICE OF BUILT-IN OSCILLATOR FOR USB INTERFACE AND METHOD THEREOF

(75) Inventors: Chih-Wei Yang, Hsinchu (TW); Chien-Hsun Lee, Hsinchu (TW); Hsiang-Sheng Liu, Hsinchu (TW); Juh-Gua Shiau, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 112 days.

(21) Appl. No.: 11/408,040

(22) Filed: Apr. 21, 2006

(65) Prior Publication Data

US 2007/0216487 A1 Sep. 20, 2007

(30) Foreign Application Priority Data

Mar. 1, 2006 (TW) ............... 95106881 A

(51) Int. Cl.
*H03D 3/24* (2006.01)
*H03L 7/085* (2006.01)
*H03L 7/033* (2006.01)

(52) U.S. Cl. .................. 331/25; 375/376; 713/400

(58) Field of Classification Search ............... 331/1 A, 331/14, 17–18, 25; 327/156–159; 332/127; 360/51; 375/376; 455/260; 710/61; 713/400–401
See application file for complete search history.

(56) References Cited

U.S. PATENT DOCUMENTS 6,407,641 B1 6/2002 Williams et al.
6,954,506 B2 * 10/2005 Cho ........................... 375/321

* cited by examiner

*Primary Examiner*—David Mis
(74) *Attorney, Agent, or Firm*—Rosenberg, Klein & Lee

(57) ABSTRACT

An adjusting frequency device of built-in oscillator for USB interface and a method thereof are described. It is Auto detect the error of bit-rate between the USB host and the USB device, and produce tiny counting time for clocking the clock error between the USB host and the USB device by a delay lock loop. The clock error after quantification, digitization and operation outputting a quantitative code, then the oscillator adjusts the oscillation frequency according to the quantitative code. Whereby adjusting the oscillation frequency of the USB device and the frequency of the USB host to less than 1% clock error for ensuring the accuracy of data transmission.

26 Claims, 11 Drawing Sheets

ADJUSTING FREQUENCY DEVICE OF BUILT-IN OSCILLATOR FOR USB INTERFACE AND METHOD THEREOF

BACKGROUND OF THE INVENTION

1. Field of the Invention

The present invention relates to an adjusting frequency device for oscillator and a method thereof, in particular, the present invention relates to an adjusting frequency device of built-in oscillator for USB interface and a method thereof.

2. Background of the Invention

In conventional devices, such as phase lock loops (PLL) architecture, it is impossible to lock to synchronize the bit-rates of data stream in USB data transmission specification. Since PLL requires longer and continuous input reference clock to accomplish lock operations, it hence needs very long lock time and the circuits designed must be accurate, otherwise it might cause clock errors and erroneously fetched reference signals would probably occur.

In the U.S. Pat. No. 6,407,641, titled as "AUTO-LOCKING OSCILLATOR FOR DATA COMMUNICATION", there disclosed a technology for solving the above-mentioned problems. Refer to FIG. 1, a block diagram for an automatic adjusting oscillator of prior art is shown, wherein mainly comprising an adjusting circuit 101 and an oscillator 102. The data stream analysis module 104 receives a data stream and a clock signal from an input 112 and an input 116, respectively. The data analysis module sends a control signal C to control a coarse tuning circuit 106, then outputs a control signal F to control a fine tuning circuit 108. Following this, the coarse tuning circuit 106 then sends a control signal C1 to the oscillator 102 to adjust oscillating frequency, whereas the fine tuning circuit 108 sends a control signal F1 to the oscillator 102. Finally, the oscillator 102 outputs and feeds back the well-adjusted frequency.

The technology disclosed in U.S. Pat. No. 6,407,641 though improved the well-known problems; however, during the process of the coarse tuning circuit 106 therein it still requires four-bit input reference data, and during the process of the fine tuning circuit 108 it also requires twenty-bit input reference data, such technology therefore still needs to count long USB packet data from the host transmit side as reference signals. Besides, it is also necessary to incorporate the use of high frequency timings to perform actions of error counting, so as to adjust frequency to reduce the chances that the reference signals being erroneously fetched.

SUMMARY OF THE INVENTION

In view of the above-mentioned issues, the present invention provides an adjusting frequency device of built-in oscillator for USB Interface and a method thereof, which requires neither use of high frequency timing for actions of error counting, nor counting long USB packet data from the host side as the reference signals, hence reduces the chances that the reference signals being erroneously fetched.

The present invention provides an adjusting frequency device of built-in oscillator for USB interface, comprising a delay lock loop (DLL), a computation module, an oscillator, a first frequency divider and a second frequency divider. Wherein the error compare module is used to receive a USB reference signal and a feedback signal, and outputs a quantitative value according to the reference signal of a time sector offered by the DLL. Next, the computation module computes the quantitative value, and converts the obtained quantitative value into a quantitative code; the oscillator then adjusts the oscillation frequency based on the quantitative code. After frequency division by the first frequency divider, the oscillation frequency of the oscillator is fed back to the error compare module; meanwhile, after frequency division by the second frequency divider, the oscillation frequency of the oscillator is provided as a frequency-adjusted signal output.

The present invention furthermore provides an adjusting frequency device of built-in oscillator for USB interface, comprising a delay lock loop (DLL), an error compare module, a multiplexing quantifier, a conversion unit, a computation module, an oscillator, a first frequency divider and a second frequency divider. Wherein the error compare module compares a USB reference signal and a feedback signal, then outputs a compared error signal, and the multiplexing quantifier quantifies the error signal according to the reference signal of a time sector offered by the DLL, and outputs a quantitative value and an operation reference signal. Next, the conversion unit receives and digitalizes this quantitative value, and the computation module receives the operation reference signal and the digitalized quantitative value, outputs a second quantitative code after being operated with a first quantitative code. Following this, the oscillator adjusts the oscillation frequency of the oscillator according to the second quantitative code. After frequency division by the first frequency divider, the oscillation frequency of the oscillator is fed back to the error compare module; meanwhile, after frequency division by the second frequency divider, the oscillation frequency of the oscillator is provided as a frequency-adjusted signal output.

The present invention furthermore provides an adjusting frequency method of built-in oscillator for USB interface, wherein steps thereof comprise, first, to provide a USB reference signal and a feedback signal. Next, use a reference signal of a time sector to quantify error time between the USB reference signal and the feedback signal, then compute such quantified error times, and converting the results into a quantitative code. Finally, adjust the oscillation frequency of an oscillator according to the quantitative code.

In summary, by means of the technology of the present invention, it is possible to synchronize the internal clock of a component with the data rate signal from a USB host, enabling the system to, during transmission process of data packets, perform quick and direct fine tunings on clock error precision adjustment to let it be less than 1%, hence assuring accuracy and stability thereof. Additionally, the present invention requires no use of externally connected crystal oscillators, thus reducing external areas, as well as component costs, which provides an excellent option over the broad realms of telecommunication transmissions.

To facilitate further understandings of the features and technical contents of the present invention, detailed descriptions and appended drawings are hereunder provided as references thereof; however, the appended drawings are merely for the purpose of references and illustrations, without any intention to limit the scope of the present invention.

DETAILED DESCRIPTION OF PREFERRED EMBODIMENTS

Figure 1:
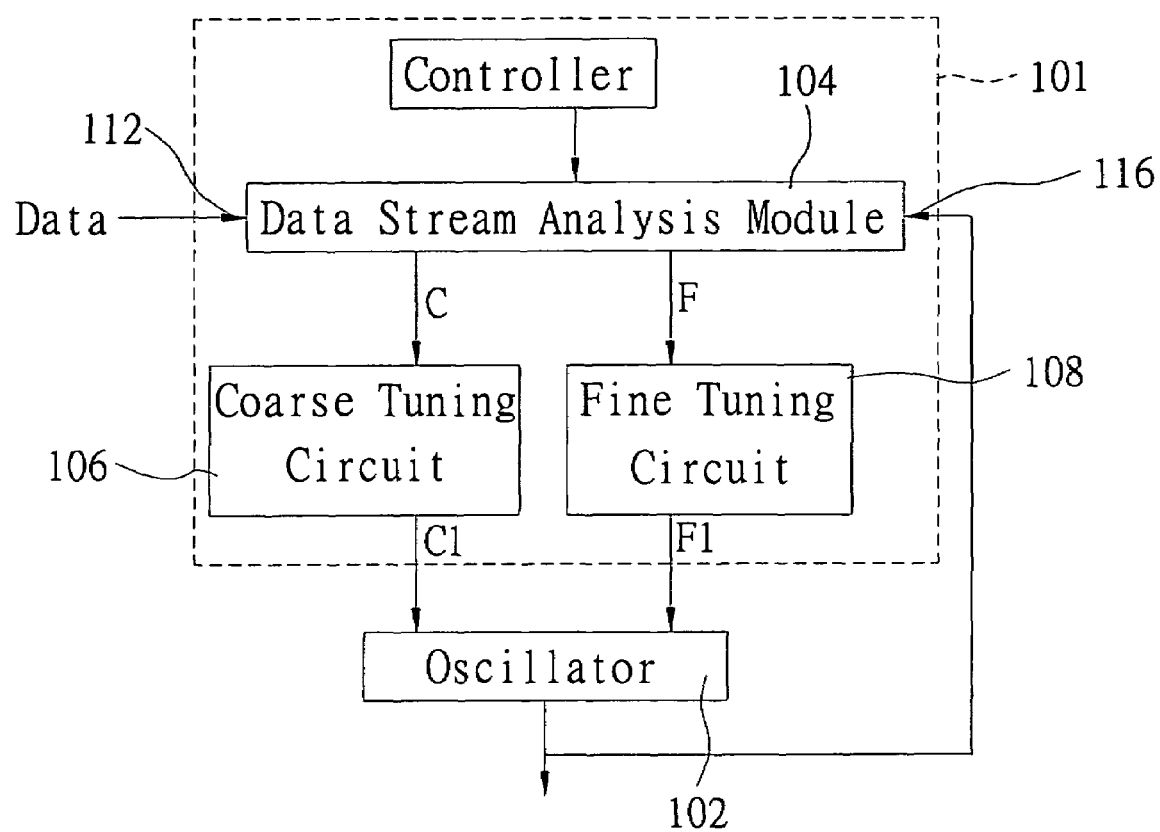
FIG. 1 shows a functional block diagram of an automatic adjusting oscillator of prior art.
Figure 2:
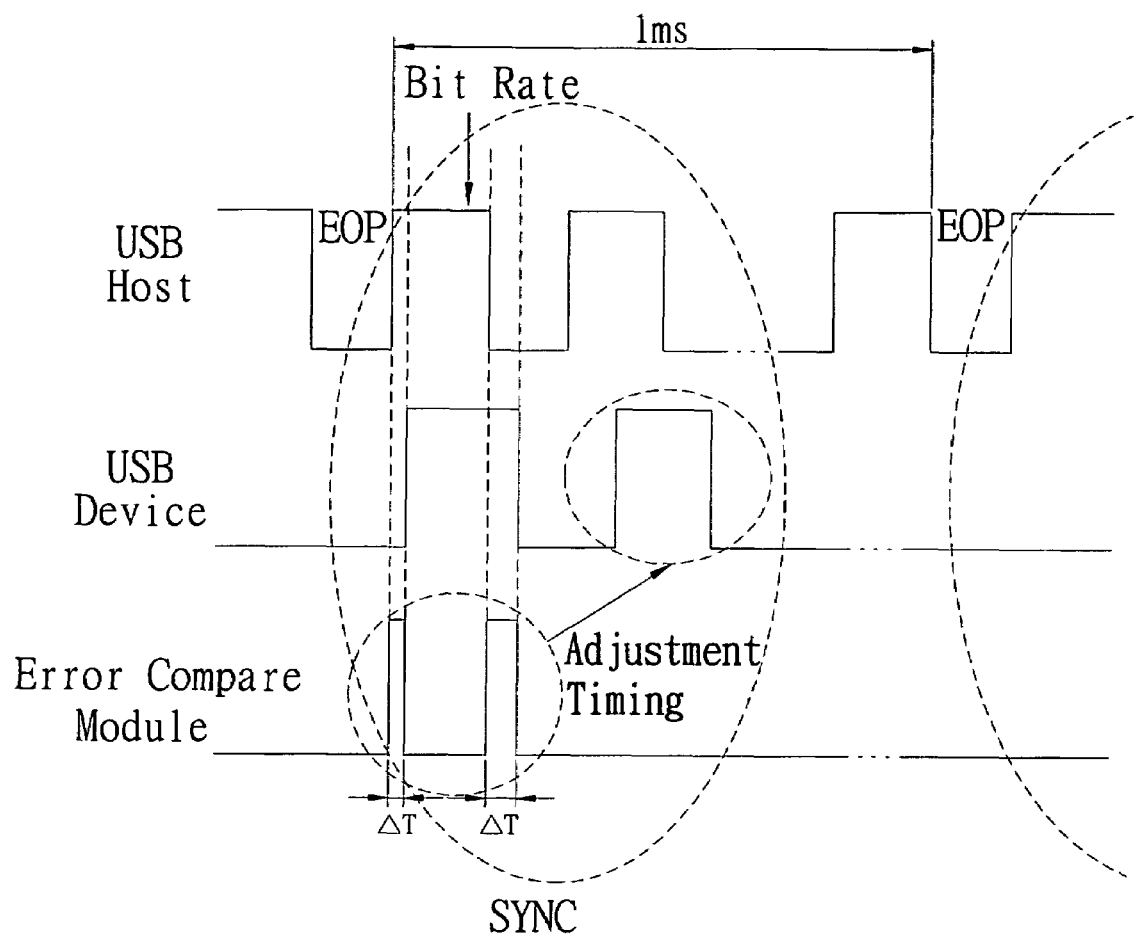
FIG. 2 shows a time series diagram of adjusting frequency timings according to the present invention.

Now refer to the time series diagram of adjusting frequency times according to the present invention, as shown in FIG. 2. In the transmission specification of USB low speed 1.1, whenever a synchronization signal (SYNC) originating from a USB host enters, a complete bit-rate size can be acquired and used as a reference signal for computing the error time Δt with regard to the USB device, which obtains the clock error between these two signals; then, in the successive signal, use this to perform tuning operation, adjusting frequency thereof in order to synchronize the signal.

Figure 3:
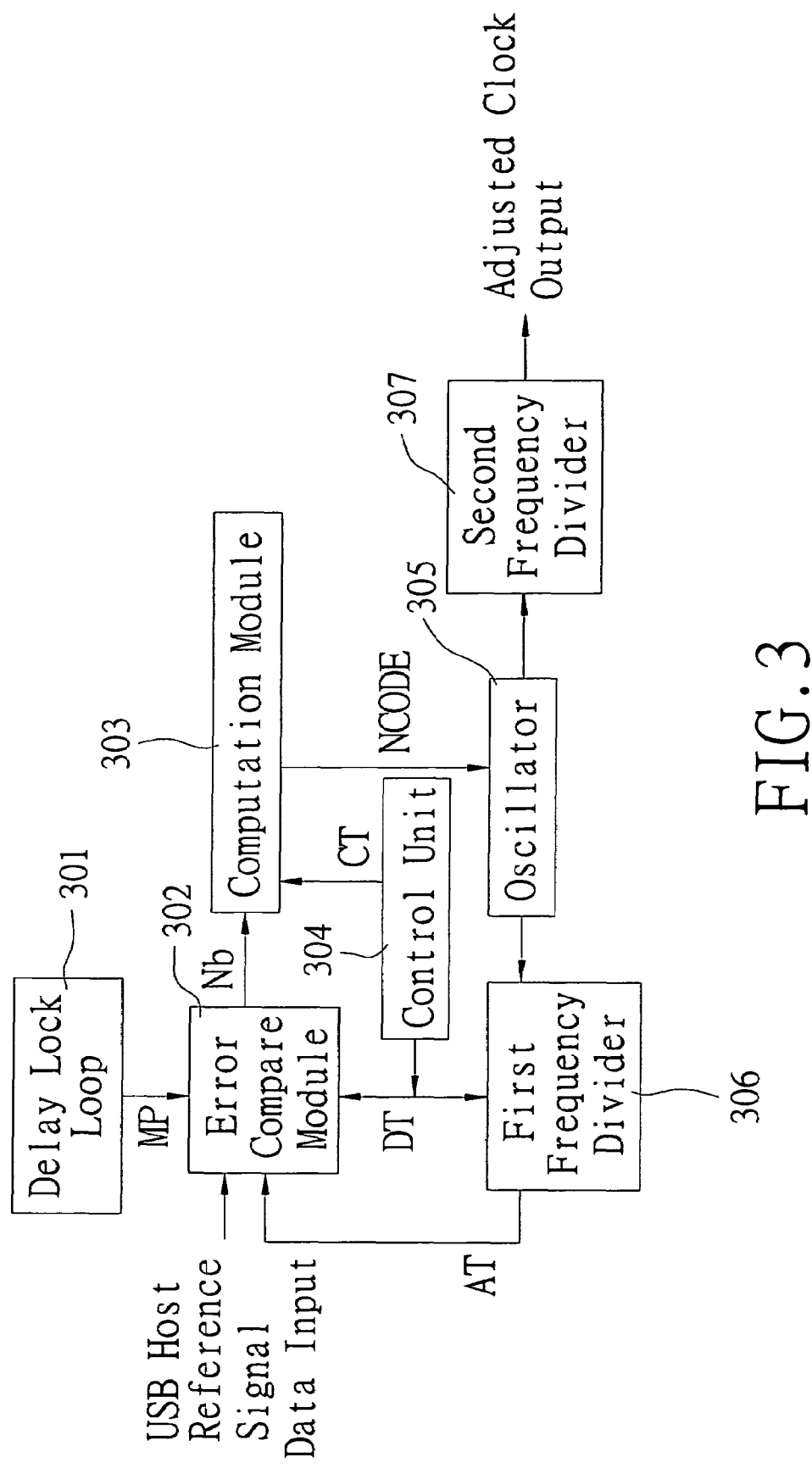
FIG. 3 shows a functional block diagram of an adjusting frequency device according the present invention.

Next, refer to the FIG. 3, wherein shown the functional block diagram of an adjusting frequency device according to the present invention. As the reference signal data from an externally connected USB host enters, it will first reach the error compare module 302, and the error compare module 302 will get its data bit-rate size, performing time compare of frequency error with the feedback signal AT obtained from frequency division through the first frequency divider 306 generated by the oscillator 305 of the component side, in which the obtained error time is computed and quantified by means of the reference signal MP of a time sector provided by the delay lock loop 301, then outputs a quantitative value Nb. Here, the reference signal MP of the time sector is a reference signal comprising several tiny time sector points, and the error compare module 302 uses those tiny time points of the reference signal MP of the time sector, as clocks, to count and quantify the size of error time.

Next, send the quantitative values Nb generated from different error times to the computation module 303, converting them into quantitative codes and applying operations thereon, then converting the operation results into a quantitative code NCODE. The oscillator 305 receives the quantitative code NCODE and executes frequency adjustment, hopping to the correct position, and outputs the feedback signal AT, obtained from frequency division of the adjusted frequency by the first divider 306, to the error compare module 302; meanwhile, outputs an adjusted clock signal, obtained from frequency division of the adjusted frequency by the second divider 307, to the USB device. Additionally, the control unit 304 is used to coordinate actions among various modules in the system, and as soon as the SYNC signal from the USB host enters, a control signal DT is employed to activate the error compare module 302. After quantification applied on the error time of the error compare module 302, compute the action time of the computation module 303, and inform by means of the control signal CT. Besides, the control unit 304 also controls the division times of the first divider 306, and fetch times on signals, to ensure the correct data flows.

Now illustrate how to generate the above-mentioned the reference signal of tiny time sector points to count error time Δt, in which the Delay Lock Loop (DLL) approach is adopted to create the reference signal (MP, multi-phase) of time sectors, enabling use of low frequency time clock to acquire tiny time points, thus avoiding utilizing high frequency clock to count. The formula for DLL to generate a step time of a time sector is $$\sigma T = \frac{1}{f} * \frac{1}{Na} \quad (1)$$

where f is the clock frequency of pre-division, Na is the numbers of time sectors, hence the formula for computed error time becomes:

$$\Delta T = Nb * \sigma T \quad (2)$$

Therefore, a tiny step of time σt can be defined as resolution, and now the data-bit rate of USB low speed 1.1 is 1.5 MHz, i.e. clock is 666.67 ns. If the clock error required by the system specification should be with an error rate less than 1%, then for the sake of security, it is practical, on design, to set the resolution to be ½ error rate, i.e. 0.5%, which is equal to 3.33 ns. Now refer to FIG. 4, in which a design diagram of the delay lock loop according to the present invention is shown, wherein assuming DLL employs a frequency f of 6. MHz, Na of 50 time sector points. From formula (1), it will generate a tiny time sector of 3.33 ns, thus the error times ΔT of different degree obtained by the error compare module 302 correspond to different quantitative value Nb's (several time sector points), as formula (2).

Figure 5:
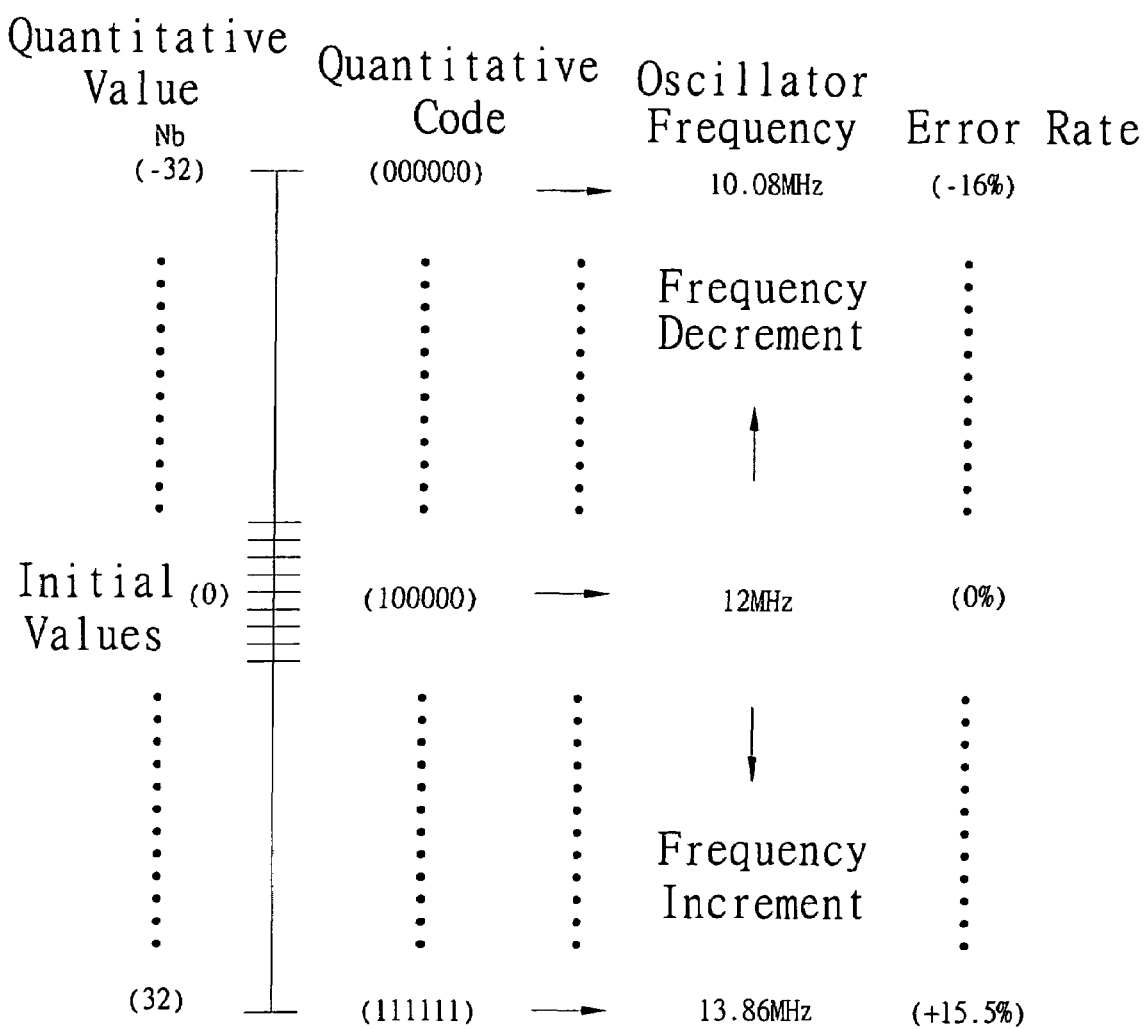
FIG. 5 shows the mapping design table of the computation module and the oscillator according to the preferred embodiment of the present invention.

However, having acquired the quantitative value Nb, it is possible to convert it, through the computation module 303, into the quantitative code NCODE receivable for the oscillator 305. And in view of the design in the computation module 303, it is intended to work together with the oscillator 305, hence after that the oscillator 305 has received the quantitative code NCODE intended to be converted, the original frequency will be changed to the frequency value synchronous with the USB host. Refer now to FIG. 5, in which the computation module and the mapping design table of the oscillator according to the preferred embodiment of the present invention are shown, we can build the mapping design table, whose resolution is 0.5%, and here assuming the initial central frequency of the oscillator 305 to be 12 MHz, quantitative code NCODE of the computation module 303 to be 6 bits, and the corresponding central quantitative code NCODE will become 100000, then the corresponding highest and lowest frequencies of the oscillator 305 are 13.86 MHz (111111) and 10.08 MHz (000000) respectively, hence error range percentage −16% ~15.5%, which means the error rate of frequency variation in this section can be amended to fall within 1%. The initial central frequency of the oscillator 305 is not limited to 12 MHz, and based on the number of bits in the quantitative code NCODE, it is possible to set the span of the error range percentage, thus the error rate of frequency variation in the span of the error range percentage can adjusted to be less than 1%.

Figures 6A, 6B:
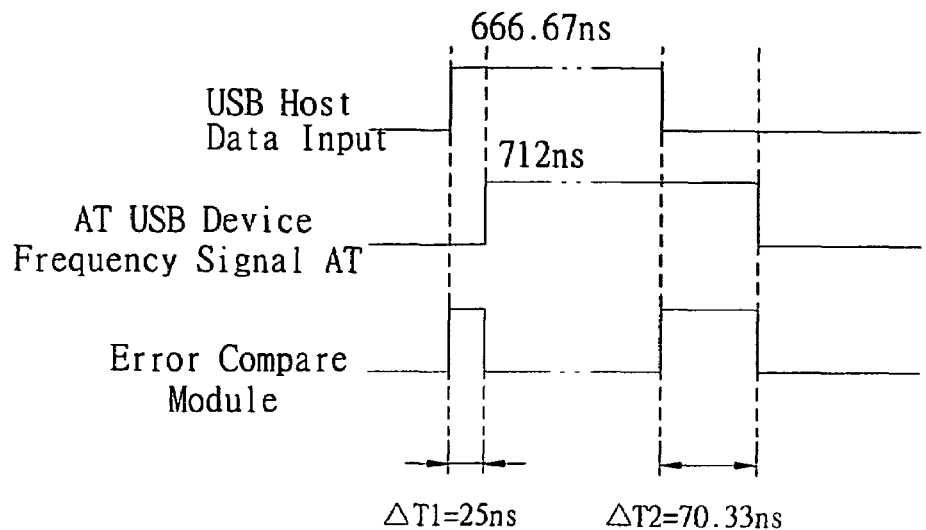
FIG. 6A shows a time series diagram according to the first preferred embodiment of the present invention.
FIG. 6B shows the mapping design table according to the first preferred embodiment of the present invention.

Now refer to FIG. 6A, wherein a time series diagram according to the first preferred embodiment of present invention is shown. As illustrated in FIG. 6A, errors occurred in the frequency feedback signal AT of the oscillator 305 on the USB device, wherein the clock width is 712 ns, and the bit-rate difference from the data input on the USB host is the error rate of 6.8%. When the data input on the USB host enters and thus activates the system feedback mechanism, the signal will first pass through the error compare module 302 in order to find the error time $\Delta T$ between the two signals. Accordingly, the rising error time $\Delta T1=25$ ns and the falling error time $\Delta T2=70.33$ ns are found. Subsequently, use the tiny time sectors generated by the delay lock loop 301, as clock, to count the error time thereof, in which the resolution of the delay lock loop 301, $\sigma T$, is 3.33 ns, as shown in formula (2), obtaining the solution of $\Delta T1$, which is 25 ns/3.33 ns=7.5, taking the quantitative value N1 of $\Delta T1$ as $-7$ (which represents leading relation), whereas the solution of $\Delta T2$, 70.33 ns/3.33 ns=21.12, taking the quantitative value N2 of $\Delta T2$ as 21 (which represents lagging relation). Here the positive/negative signs are marked because of the leading or lagging relation in phase. Next, the computation module 303 computes the quantitative value N1 and the quantitative value N2, adds them up and obtains the quantitative value Nb which is +14, and performs hopping (change code) according to the table designed on the basis of the cooperation of the computation module 303 and the oscillator 305. Refer now again to FIG. 6B, wherein the mapping design table of the first preferred embodiment of the present invention is shown, as illustrated in the Figure, the shown quantitative code NCODE will jump from (100000) to (101110). Whereas the way of hopping (change frequency) for the oscillator 305 is fo±n* σf; that is, 11.24 MHz+14*(11.24*0.5%)=12.03 MHz, thus the frequency of the oscillator 305 increases from 11.24 MHz to 12.03 MHz, and after passing through the first frequency divider 306, the bit-rate of the feedback signal AT becomes 1.504 MHz, hence the error rate between such result and the bit-rate of the USB host, 1.5 MHz, reduces to 0.25%, falling within the range of 1% error rate.

Figure 7A:
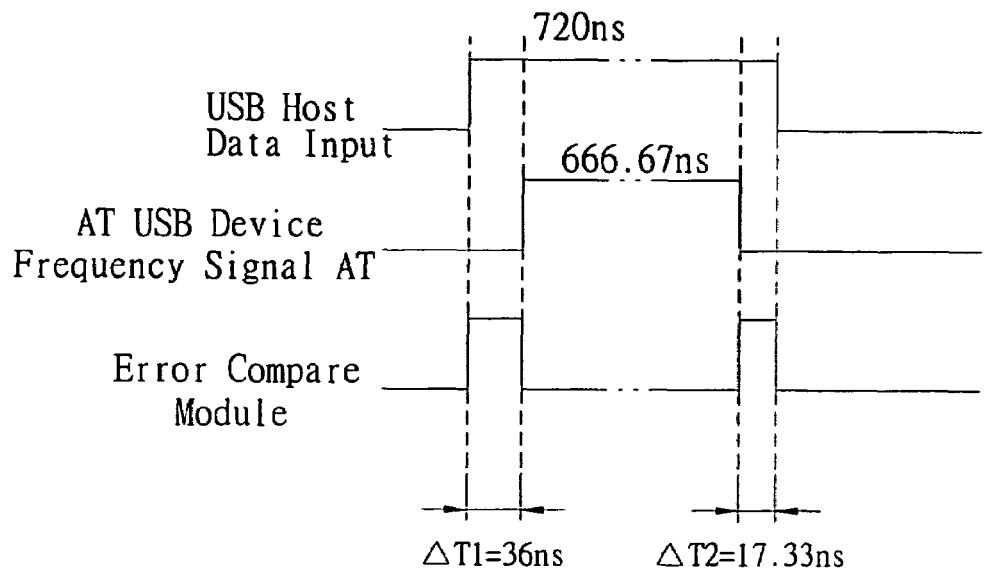
FIG. 7A shows a time series diagram according to the second preferred embodiment of the present invention.
Figure 7B:
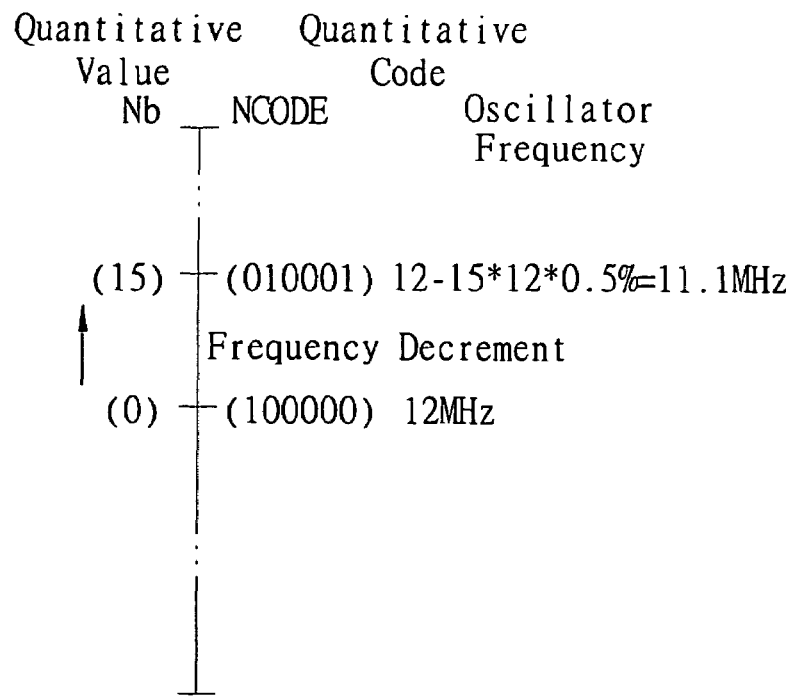
FIG. 7B shows the mapping design table according to the second preferred embodiment of the present invention.

Now refer to FIG. 7A, a time series diagram of the second preferred embodiment of the present invention is shown. As illustrated in FIG. 7A, there occurred drifting on the bit-rate of USB host data input, which became 1.389 MHz (720 ns), causing the error rate $-7.4\%$ from the 1.5 MHz (666.67 ns) of the USB device. Similarly, the error compare module 302 is first used to find the error time between $\Delta T1$ and $\Delta T2$, 36 ns and 17.33 ns, for such two signals. Then by means of the clocking of delay lock loop 301, based on the formula (2), obtaining the solution for $\Delta T1$ 36 ns/3.33 ns=10.81 and taking the quantitative value N1 for $\Delta T1$ as $-10$ (as leading relation); meanwhile, the solution for $\Delta T2$ 17.33 ns/3.33 ns=5.2 and taking the quantitative value N2 for $\Delta T2$ as $-5$ (as lagging relation). Following this, the computation module 303 computes the quantitative value N1 and the quantitative value N2, adds them up and obtains the quantitative value Nb, $-15$, then performs hopping (change code) according to the table designed on the basis of the cooperation of the computation module 303 and the oscillator 305. Refer again to FIG. 7B, wherein the mapping design table according to the second preferred embodiment of the present invention is shown, as illustrated in the Figure, the quantitative code NCODE jumps from (100000) to (010001), the frequency of the oscillator 305 is 12 MHz$-15*(12*0.5\%)$ =11.1 MHz, decreasing from 12 MHz to 11.1 MHz; after being divided by 16 through the first frequency divider 306, the bit-rate of the feedback signal AT becomes 1.504 MHz, hence the error percentage between such result and bit-rate of the reference data on the USB host, 1.389 MHz, will be merely $-0.18\%$, less than 1% error rate.

Figure 8:
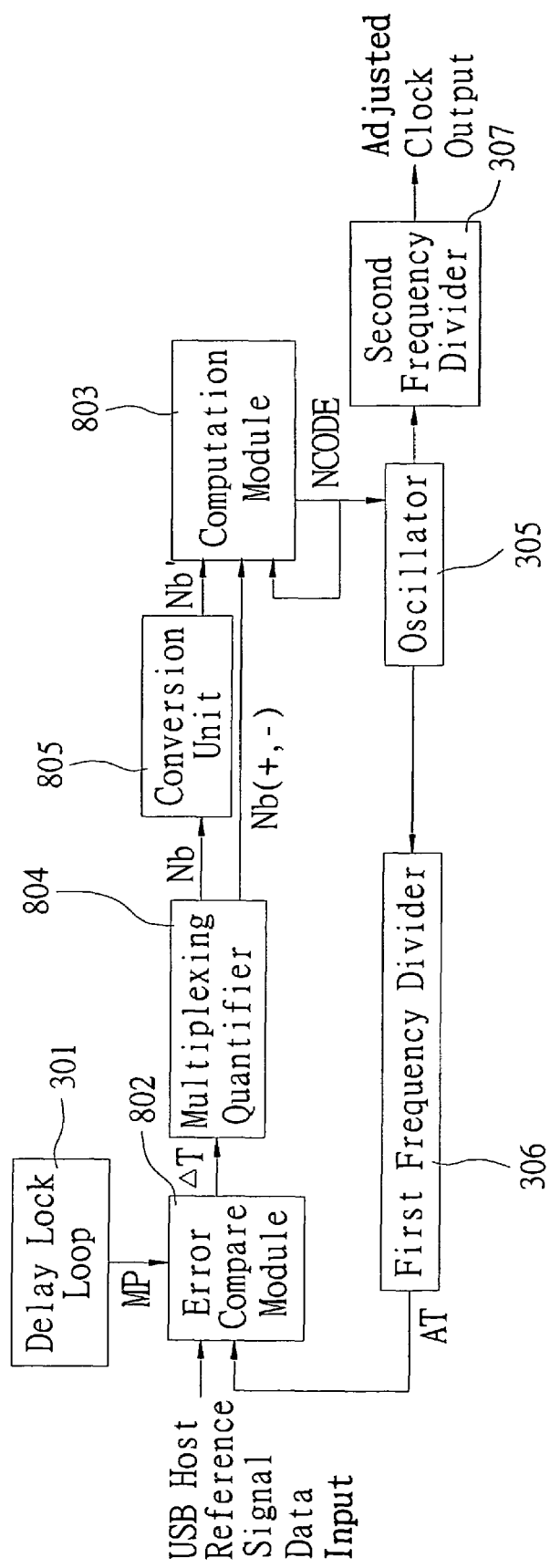
FIG. 8 shows a functional block diagram of an alternative adjusting frequency device according to the present invention.

Now refer to FIG. 8, which displays a functional block diagram of an alternative adjusting frequency device according to the present invention. Here, the error compare module 802 compares reference signal data input from the USB host and the feedback signal AT, obtaining the error time $\Delta T$ between these two signals. Such an error time $\Delta T$ is sent to the multiplexing quantifier 804, and the multiplexing quantifier 804 processes and integrates the reference signal (MP, multi-phase) of the time sector generated by the delay lock loop 301, detecting the quantitative value Nb of the error time $\Delta T$, then judging the positive/negative sign of the quantitative value Nb to learn whether the frequency is to be increased or decreased. In which the reference signal MP of the time sector is a reference signal of several tiny time sector points, and the multiplexing quantifier 804 uses these tiny time points of the reference signal MP of the time sector, as clock, to count and quantify the size of error time. Then, the conversion unit 805 converts the quantitative value Nb into digital code Nb', and sends the sign (Nb(+,−)) of the Nb to the computation module 803. At the computation module 803, it calculates new quantitative code NCODE based on the mapping design table of the computation module 803 and the oscillator 305, and the oscillator 305 jumps to the correct position according to the quantitative code NCODE, in order to correctly adjust the frequency of the oscillator 305. Then, after the adjusted frequency being frequency divided by the first frequency divider 306, the feedback signal AT will be output to the error compare module 802; meanwhile, after the adjusted frequency being frequency divided by the second frequency divider 307, the adjusted clock signal will be output to the USB device.

The present invention employs a delay lock loop 301 of lower frequency to generate several tiny time sector points (multi-phase), obtaining different time points to quantify the error time $\Delta T$. There exist various delay lock loop architectures for creating several tiny time sector points, and no further illustrations thereof will be described here; however, they all involve in considering f (clock frequency) as well as Na (number of time sector points), referring to formula (1). In the above-mentioned example, we took the frequency f=6 MHz, Na=50 time sector points. In case considering that too many time sector points will cause too many components, it is possible, then, incorporating the design of the multiplexing quantifier 804, to reduce the components that the delay lock loop 301 requires for generating time sector points.

Figure 4:
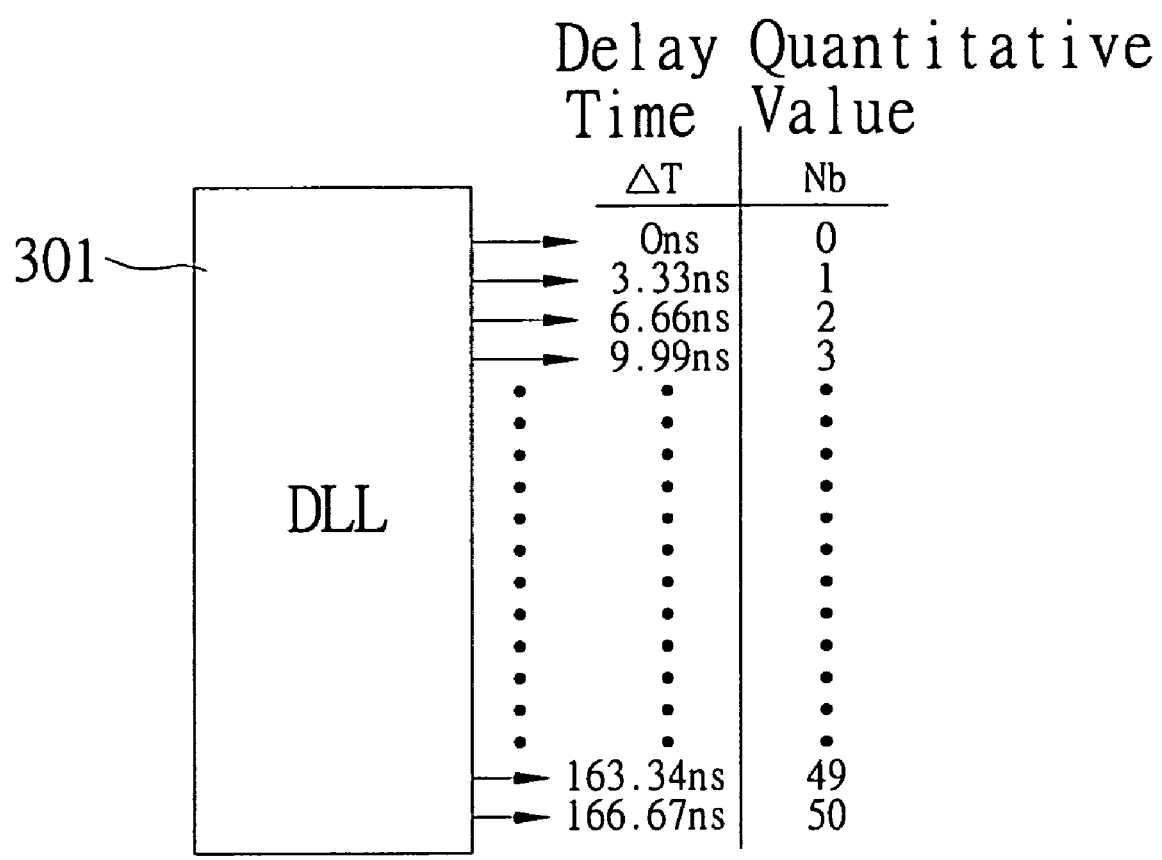
FIG. 4 shows a design diagram of the delay lock loop according to the present invention.
Figure 9A:
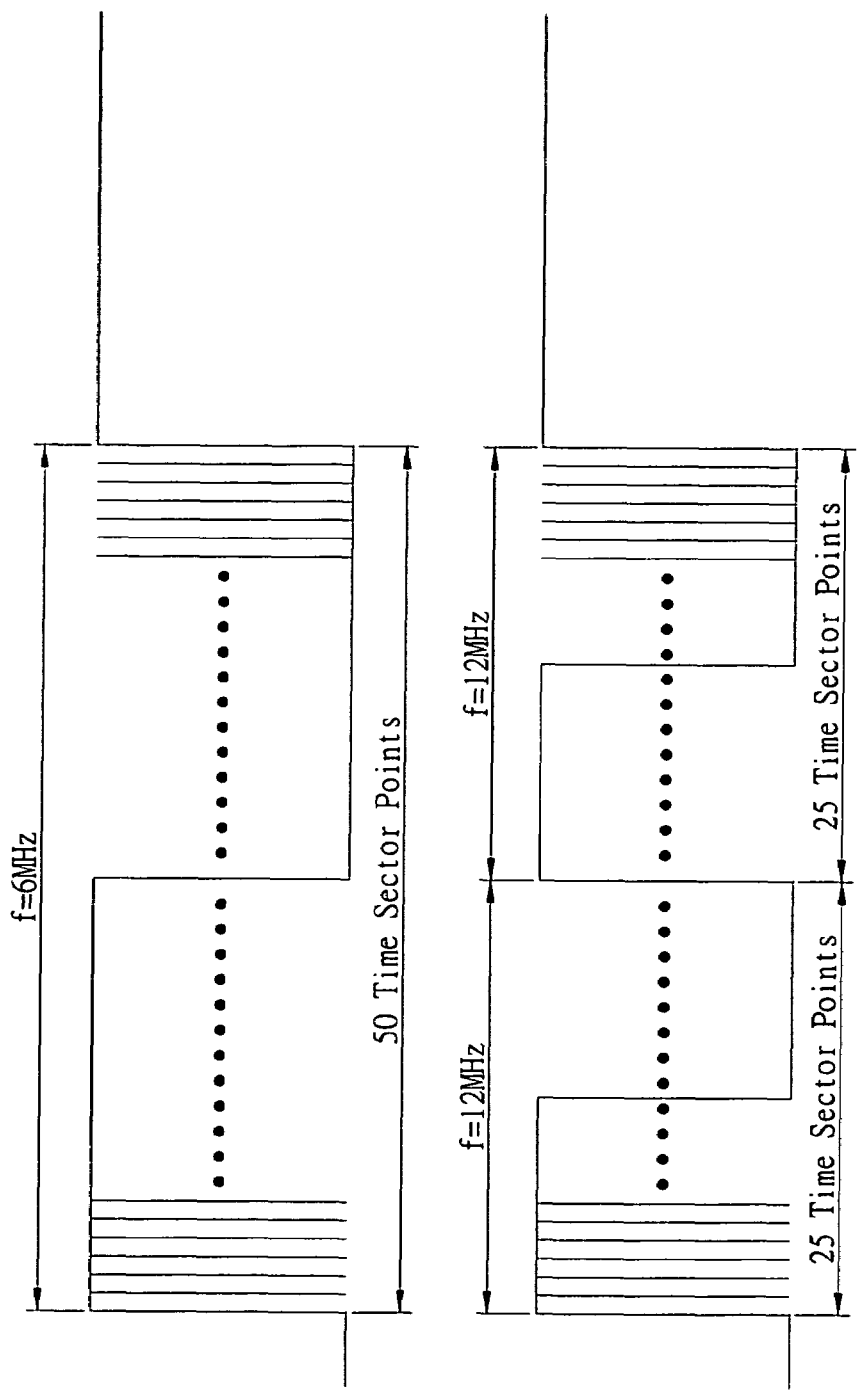
FIG. 9A shows a relationship diagram of frequency and time sector points.
Figure 9B:
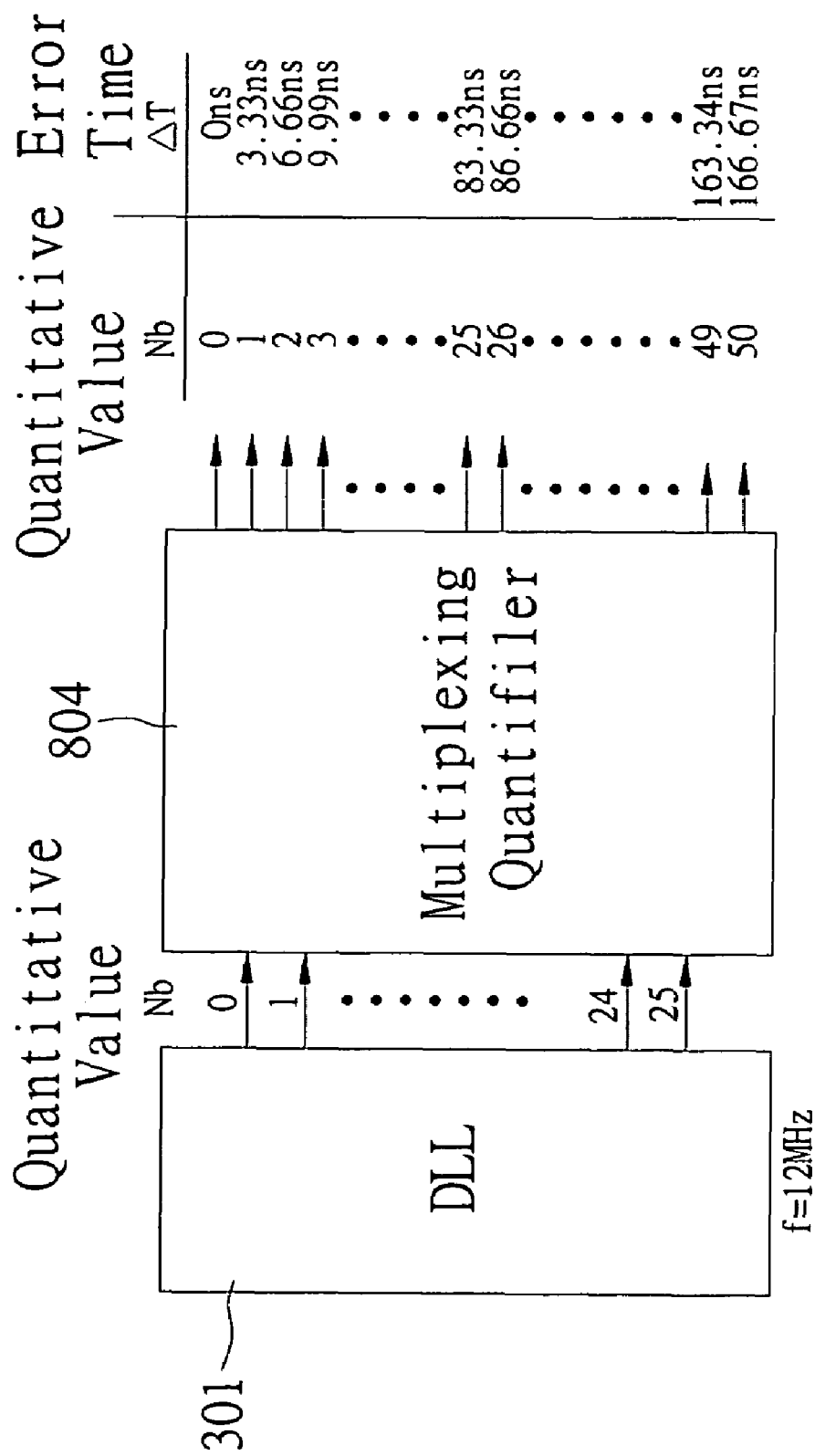
FIG. 9B shows the design diagram of the delay lock loop according to the present invention, cooperating with a multiplexing quantifier.

Refer now to FIG. 9A, a relation diagram of frequency and time sector points. As shown in FIG. 9A, here assume presently we take frequency f=12 MHz, Na=25 time sector points, as the way the clock employs in minute/second, then cooperating with the above-mentioned the multiplexing quantifier 804, it can mark one cycle of 12 MHz frequency (83.33 ns) as one minute, then view which time sector point as which second, it can similarly reach the action mode of 50 time sector points for 6 MHz frequency. As in FIG. 9B, in which the design diagram of the delay lock loop according the present invention, cooperating with the multiplexing quantifier, is shown, wherein in accordance with the way that the multiplexing quantifier 804 operates on clock, it is possible to generate the designed 50 quantitative values Nb (time sector points) as shown in FIG. 4. Analogously, it can provide options in terms of the design over numbers of time sector points for different frequencies.

Figure 10:
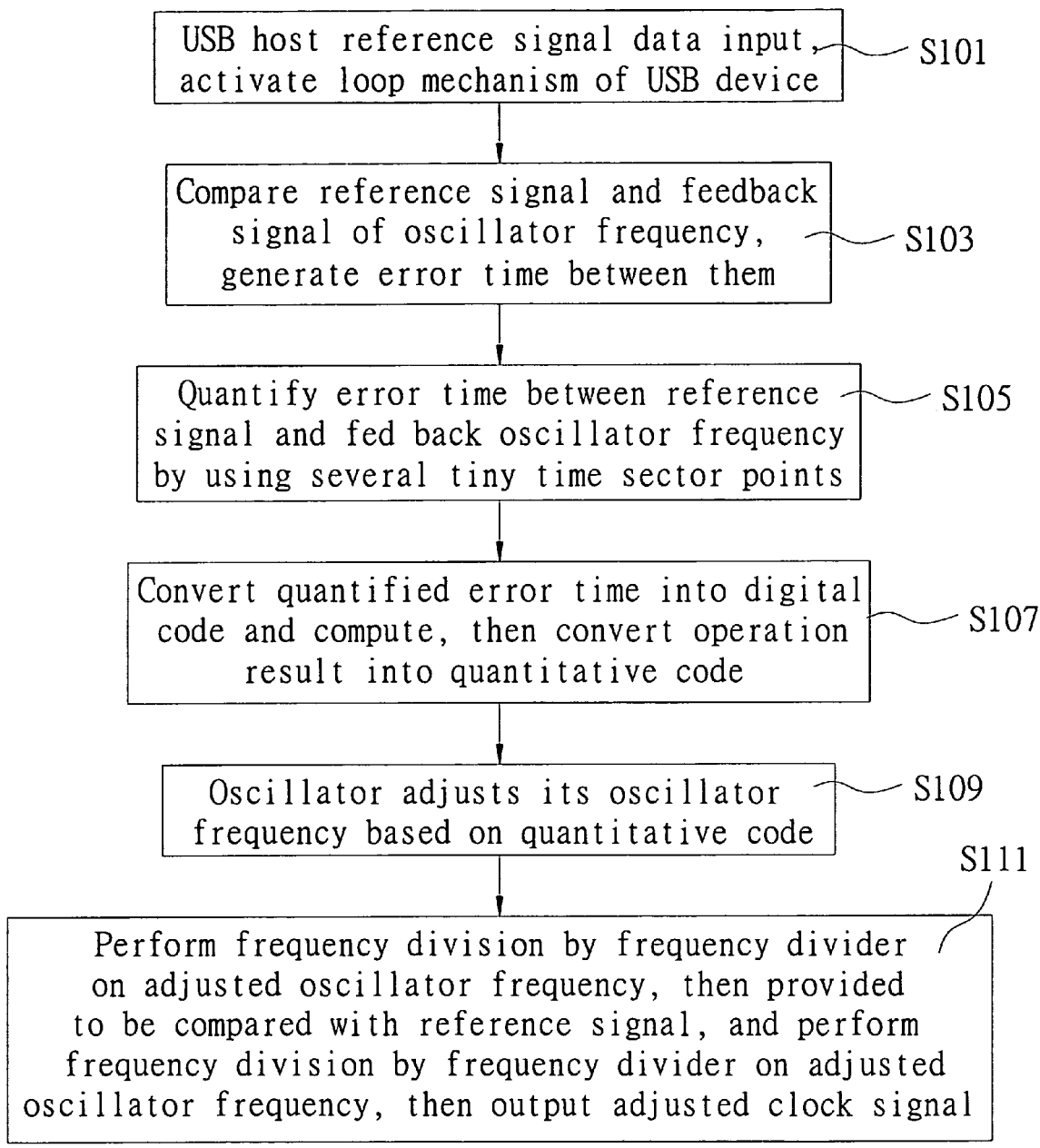
FIG. 10 shows an action flowchart of the adjusting frequency method according to the present invention.

Now refer to FIG. 10, in which an action flowchart of the frequency adjustment method according to the present invention is shown. Initially, the reference signal data input arrives from the USB host, thus activates the loop mechanism at the USB device (as step S101 in FIG. 10). Then use an error compare module to compare the reference signal and the feedback signal of the oscillator frequency, hence producing the error time between them (as step S103 in FIG. 10). Next, quantify the error time between these two signals by means of several tiny time sector points offered by the delay lock loop (as step S105 in FIG. 10). Convert subsequently the quantified error time into digital code and apply computation thereon, then convert the result into quantitative code (as step S107 in FIG. 10). The oscillator adjusts the oscillation frequency according to the quantitative code, thus hopping to the correct frequency position (as step S109 in FIG. 10). At last, after the adjusted oscillation frequency being frequency divided by the frequency divider, feed it back to the error compare module to compare with the reference signal; meanwhile, after the adjusted oscillation frequency being frequency divided by the frequency divider, the adjusted clock is output to the USB device (as step S111 in FIG. 10).

The above-mentioned actions can be realized by means of the adjusting frequency device illustrated in FIG. 3 and FIG. 8, incorporating the above-mentioned action principles, which enables automatic detection and adjustment of oscillation frequency in the oscillator within the designed range when the error in bit-rate between the USB host and of the USB device occurs excessively, thus it is possible to perform synchronization, allowing the signal error rate to decrease to the designed 1% or less, assuring the accuracy of data transmissions, hence conforming the USB low speed 1.1 specification. Furthermore, it is not necessary to employ high frequency clock to perform error counting, nor required to count long packet data from the USB host as the reference signal. Besides, under the same circumstances, the architecture of the present invention can be also applied to the clock lock synchronization, which, according to the previous descriptions, builds the mapping relation, detects the error of clock signal and automatically corrects the frequency value of output clock, enabling the system become more accurate during data transmissions.

However, the illustrations stated as above are merely the detailed descriptions and drawings of the preferred embodiments of the present invention, the features of the present invention are not by all means limited thereto, nor will these illustrations be used to constrain the present invention, the scope of the present invention should be based on the following claims, any embodiments that conform to the spirit of the claims and similar variations thereof should hence be included in the field of the present invention, all changes and modifications that any persons skilled in the art of the present invention can conveniently appreciate should thus be covered by the claims.

What is claimed is:

1. An adjusting frequency device of built-in oscillator for USB interface, comprising:
    a delay lock loop (DLL), which provides a reference signal of a time sector;
    an error compare module, which receives a USB reference signal and a feedback signal, and outputs a quantitative value according to the reference signal of the time sector;
    a computation module, which computes the quantitative value, and converts the obtained quantitative value into a quantitative code;
    an oscillator, which adjusts the oscillation frequency of the oscillator based on the quantitative code;
    a first frequency divider, which performs frequency division on the oscillation frequency of the oscillator, then outputs the feedback signal to the error compare module; and
    a second frequency divider, which performs frequency division on the oscillation frequency of the oscillator, then provides a frequency-adjusted output signal.

2. The adjusting frequency device according to claim 1, wherein the adjusting frequency device furthermore comprises a controller, which is electrically connected to the error compare module, the computation module and the first frequency divider, in order to control the actions of the error compare module, the computation module and the first frequency divider.

3. The adjusting frequency device according to claim 1, wherein the error compare module quantifies the error time between the reference signal of the USB and the feedback signal based on the reference signal of the time sector, in order to output the quantitative value.

4. The adjusting frequency device according to claim 3, wherein the error compare module quantifies the error time between the reference signal of the USB and the feedback signal by using the time sector points generated from the reference signal of the time sector, in order to output the quantitative value.

5. The adjusting frequency device according to claim 1, wherein the quantitative value is obtained in a way that the computation module performs addition/subtraction operations, then converts to the said quantitative value.

6. The adjusting frequency device according to claim 1, wherein the computation module converts the computed quantitative value into the quantitative code receivable for the oscillator by means of a mapping design table.

7. The adjusting frequency device according to claim 6, wherein the mapping design table designs the adjustment capacity range of the oscillation frequency in the oscillator by means of setting the number of bits in the quantitative code.

8. An adjusting frequency device of built-in oscillator for USB interface, comprising:
    a delay lock loop (DLL), which provides a reference signal of a time sector;
    an error compare module, which compares a USB reference signal and a feedback signal, then outputs a compared error signal;
    a multiplexing quantifier, which quantifies the error signal according to the reference signal of the time sector, and outputs a quantitative value and an operation reference signal;
    a conversion unit, which receives and digitalizes the quantitative value;
    a computation module, which receives the operation reference signal and the digitalized quantitative value, and outputs a second quantitative code after being operated with a first quantitative code;
    an oscillator, which adjusts the oscillation frequency of the oscillator according to the second quantitative code;
    a first frequency divider, which performs frequency division on the oscillation frequency of the oscillator, then outputs the feedback signal to the error compare module; and a second frequency divider, which performs frequency division on the oscillation frequency of the oscillator, then provides a frequency-adjusted output signal.

9. The adjusting frequency device according to claim 8, wherein the multiplexing quantifier quantifies the error signal according to reference signal of the time sector, and outputs the quantitative value.

10. The adjusting frequency device according to claim 9, wherein the multiplexing quantifier quantifies the error signal by using the time sector points generated from the reference signal of the time sector, and outputs the quantitative value.

11. The adjusting frequency device according to claim 8, wherein the multiplexing quantifier designs the required quantitative value range according to difference of the reference signal frequencies of the time sector.

12. The adjusting frequency device according to claim 8, wherein the first quantitative code is the signal which the second quantitative code feeds back to the computation module.

13. The adjusting frequency device according to claim 8, wherein the second quantitative code is obtained in a way that the computation module, according to the operation reference signal, performs addition/subtraction operations on the digitalized quantitative value and the first quantitative code.

14. The adjusting frequency device according to claim 8, wherein the computation module converts the computed quantitative value into the second quantitative code receivable for the oscillator by means of a mapping design table.

15. The adjusting frequency device according to claim 14, wherein the mapping design table designs the adjustment capacity range of the oscillation frequency in the oscillator by means of setting the number of bits in the second quantitative code.

16. An adjusting frequency method of built-in oscillator for USB interface, wherein steps thereof comprise:
    accessing a USB reference signal and a feedback signal;
    detecting the error time between the USB reference signal and the feedback signal;
    using a reference signal of a time sector to quantify the error time between the USB reference signal and the feedback signal;
    computing the quantified error times, and converting the results into a quantitative code; and
    adjusting the oscillation frequency of an oscillator according to the quantitative code.

17. The adjusting frequency method according to claim 16, wherein the feedback signal is the signal that output after the oscillation frequency of the oscillator being frequency divided by a frequency divider.

18. The adjusting frequency method according to claim 16, further comprises:
    outputting an adjusted clock signal after the oscillation frequency of the oscillator being frequency divided by a frequency divider.

19. The adjusting frequency method according to claim 16, wherein an error compare module is used to access the USB reference signal and the feedback signal, in order to detect the error time between the USB reference signal and the feedback signal.

20. The adjusting frequency method according to claim 16, wherein the reference signal of the time sector provides time sector points to quantify the error time between the USB reference signal and the feedback signal.

21. The adjusting frequency method according to claim 20, wherein the reference signal of the time sector is provided by a delay lock loop (DLL).

22. The adjusting frequency method according to claim 21, wherein a multiplexing quantifier is used to design in accordance with the reference signal of the time sector with various frequencies provided by the delay lock loop, in order to design the number of time sector points between the USB reference signal and the feedback signal.

23. The adjusting frequency method according to claim 22, wherein a multiplexing quantifier is used to quantify the error time between the USB reference signal and the feedback signal.

24. The adjusting frequency method according to claim 16, wherein the quantified error time is generated by the addition/subtraction operations performed by a computation module.

25. The adjusting frequency method according to claim 16, wherein the quantified error time, after operations, is converted into the quantitative code by means of a mapping design table.

26. The adjusting frequency method according to claim 25 wherein the mapping design table designs the adjustment capacity range of the oscillation frequency in the oscillator by means of setting the number of bits in the quantitative code.

* * * * *